United States Patent
Bobek et al.

(10) Patent No.: US 11,674,222 B2
(45) Date of Patent: Jun. 13, 2023

(54) METHOD OF IN SITU CERAMIC COATING DEPOSITION

(71) Applicant: Applied Materials, Inc., Santa Clara, CA (US)

(72) Inventors: Sarah Michelle Bobek, Sunnyvale, CA (US); Abdul Aziz Khaja, San Jose, CA (US); Ratsamee Limdulpaiboon, San Jose, CA (US); Kwangduk Douglas Lee, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 228 days.

(21) Appl. No.: 17/036,865

(22) Filed: Sep. 29, 2020

(65) Prior Publication Data

US 2022/0098728 A1    Mar. 31, 2022

(51) Int. Cl.
| | | |
|---|---|---|
| C23C 16/40 | (2006.01) | |
| C23C 16/44 | (2006.01) | |
| C23C 16/32 | (2006.01) | |
| H01L 21/033 | (2006.01) | |

(52) U.S. Cl.
CPC ........ C23C 16/4404 (2013.01); C23C 16/325 (2013.01); H01L 21/0337 (2013.01)

(58) Field of Classification Search
CPC ...... C23C 16/325; C23C 16/402; C23C 16/50
See application file for complete search history.

(56) References Cited

U.S. PATENT DOCUMENTS

| | | | | |
|---|---|---|---|---|
| 5,340,621 A * | 8/1994 | Matsumoto | ............. | H05H 1/50 |
| | | | | 427/255.393 |
| 6,875,687 B1 * | 4/2005 | Weidman | .......... | H01L 21/31633 |
| | | | | 257/E21.259 |
| 2003/0134513 A1 * | 7/2003 | Li | ..................... | H01L 21/31116 |
| | | | | 257/E21.252 |
| 2005/0051770 A1 * | 3/2005 | Ando | .................. | H01L 51/0541 |
| | | | | 257/E29.294 |
| 2005/0070073 A1 * | 3/2005 | Al-Bayati | ............. | H01J 37/321 |
| | | | | 438/460 |
| 2005/0250340 A1 * | 11/2005 | Chen | ................... | C23C 16/4404 |
| | | | | 438/758 |

(Continued)

FOREIGN PATENT DOCUMENTS

| | | |
|---|---|---|
| EP | 2228465 A1 | 9/2010 |
| JP | 2006013503 A | 1/2006 |

OTHER PUBLICATIONS

Hu, Zhihua, et al., "Amorphous silicon carbide films prepared by H2 diluted silane-methane plasma". Journal of Crystal Growth 264 (2004) 7-12.*

Kuhman, Dan, et al., "Properties of Hydrogenated Amorphous Silicon Carbide Films Prepared By Plasma-Enhanced Chemical Vapor Deposition". Thin Solid Films, 177 (1989) 253-262.*

(Continued)

*Primary Examiner* — Bret P Chen
(74) *Attorney, Agent, or Firm* — Patterson + Sheridan, LLP

(57) ABSTRACT

The present disclosure relates to a method for in situ seasoning of process chamber components, such as electrodes. The method includes depositing a silicon oxide film over the process chamber component and converting the silicon oxide film to a silicon-carbon-containing film. The silicon-carbon-containing film forms a protective film over the process chamber components and is resistant to plasma processing and/or dry etch cleaning. The coatings has high density, good emissivity control, and reduces risk of device property drift.

19 Claims, 2 Drawing Sheets

(56) References Cited

U.S. PATENT DOCUMENTS

| | | | |
|---|---|---|---|
| 2005/0269707 A1* | 12/2005 | Nashiki | H01B 1/08 |
| | | | 438/623 |
| 2012/0276752 A1* | 11/2012 | Rangarajan | H01J 37/32091 |
| | | | 257/E21.24 |
| 2013/0109197 A1* | 5/2013 | Murakami | H01L 21/32105 |
| | | | 438/770 |
| 2013/0302999 A1* | 11/2013 | Won | H01L 21/02164 |
| | | | 438/787 |
| 2016/0281230 A1 | 9/2016 | Varadarajan et al. | |
| 2017/0076956 A1 | 3/2017 | Hirayama et al. | |
| 2017/0323768 A1 | 11/2017 | Zhang et al. | |
| 2017/0335449 A1* | 11/2017 | Li | H01L 21/02348 |
| 2018/0347035 A1* | 12/2018 | Weimer | H01L 21/76834 |
| 2019/0172714 A1 | 6/2019 | Bobek et al. | |
| 2019/0181426 A1* | 6/2019 | Park | C01B 33/021 |
| 2019/0292658 A1* | 9/2019 | Li | C23C 16/36 |
| 2019/0385840 A1* | 12/2019 | Ridgeway | H01L 21/02274 |

OTHER PUBLICATIONS

Tabata, Akimori, et al., "Properties of hydrogenated amorphous silicon carbide films prepared by a separately excited plasma CVD method". J. Phys. D: Appl. Phys. 30 (1997) 194-201.*

Hollabaugh, C.M., et al., "R.F.-plasma system for the production of ultrafine, ultrapure silicon carbide powder". Journal of Materials Science 18 (1983) 3190-3194.*

Filatova, Ekaterina, et al., "Understanding the Mechanism of SiC Plasma-Enhanced Chemical Vapor Deposition (PECVD) and Developing Routes toward SiC Atomic Layer Deposition (ALD) with Density Functional Theory". ACS Applied Materials & Interfaces 2018 10 (17), 15216-15225.*

Huran, J., et al., "Structural and physical characteristics of PECVD nanocrystalline silicon carbide thin films". Physics Procedia 32 (2012) 303-307.*

Malitson, I.H., "Interspecimen Comparison of the Refractive Index of Fused Silica". Journal of the Optical Society of America, vol. 55, No. 10, Oct. 1965, pp. 1205-1209.*

Pliskin, W.A., et al., "Refractive Index of SiO2 Films Grown on Silicon". Journal of Applied Physics, vol. 36, No. 6, Jun. 1965, pp. 2011-2013.*

Boccard, Mathieu, et al., "High-Stable-Efficiency Tandem Thin-Film Silicon Solar Cell with Low-Refractive-Index Silicon Oxide Interlayer". IEEE Journal of Photovoltaics, vol. 4, No. 6, Nov. 2014, pp. 1368-1373.*

International Search Report/Written Opinion issued to PCT/US2021/050956 filed Jan. 10, 2022.

* cited by examiner

METHOD OF IN SITU CERAMIC COATING DEPOSITION

BACKGROUND

Field

Embodiments of the present disclosure generally relate to systems and methods of manufacturing a semiconductor device. More particularly, the present disclosure is directed to methods of in situ ceramic coating deposition for radio frequency active surface protection and emissivity control.

Description of the Related Art

Plasma enhanced chemical vapor deposition (PECVD) are processes used to deposit a film on a substrate, such as a semiconductor substrate. PECVD is accomplished by introducing process gases into a process chamber that contains the substrate. The process gases are directed through a gas distribution assembly and into a process volume in the process chamber.

Electromagnetic energy, such as radio frequency (RF) power is used to activate the process gases in the process chamber to generate plasma and deposit a film. As a result of a PECVD process, the process chamber is cleaned after a predetermined number of process cycles to avoid substrate film property drift. However, substrate cleaning processes, such as those using plasmas, can damage internal components of the process chamber, also leading to substrate film property drift.

Therefore, there is a need for an efficient, effective protective coating method to reduce damage to chamber components during high power processes such as cleaning.

SUMMARY

In one embodiment, a method is provided including introducing a treatment gas to a process volume of a process chamber. The treatment gas includes a silicon-containing gas, such as silane gas and an oxygen-containing gas. The gas flow ratio of silane gas to oxygen-containing gas is about 0.007 to about 0.08 by volume. The method includes a silane flow (sccm) to power (W) ratio of less than 0.07. Energizing the silane gas forms a silicon oxide ($SiO_x$) film over a process chamber component, such as a process component having an electrode and/or over a surface of an electrode. The method also includes introducing a carbon-containing gas to the process volume to form a silicon-carbon-containing film on the process chamber component.

In another embodiment, a method is provided, including introducing a treatment gas to a process volume of a process chamber, the treatment gas includes a silane gas and an oxygen-containing gas with a ratio of silane gas to oxygen-containing gas of about 0.007 to about 0.08 by volume. The silane gas is energized to form a silicon oxide ($SiO_x$) film over a process chamber component. A surface roughness (Ra) of the $SiO_x$ film is about 0.1 nm to about 0.4 nm, as determined by measuring a surface roughness of a substrate after forming the film as described herein over the substrate and measuring the roughness based on atomic force microscopy. A carbon-containing gas is introduced to the process volume to deposit a carbon-containing film on the process chamber component.

In another embodiment, a method is provided including introducing a treatment gas to a process volume of a process chamber. The treatment gas includes a silane gas and a oxygen-containing gas at a ratio of silane gas to oxygen-containing gas of about 0.007 to about 0.08 by volume. The silane gas is energized to form a silicon oxide ($SiO_x$) film over a surface of an electrode. A carbon-containing gas is supplied to the process volume to form a silicon-carbon-containing film on the surface of the electrode and/or on the silicon oxide film. The silicon-carbon-containing film includes one or more of silicon oxide ($SiO_x$), silicon oxycarbide (SiOC), and silicon carbide (SiC).

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only example embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments presented herein are directed to methods of in situ ceramic coating deposition for radio frequency active surface protection and emissivity control. A seasoning process is used to coat a seasoning layer on one or more chamber components and/or interior surfaces of a process chamber.

Figure 1:
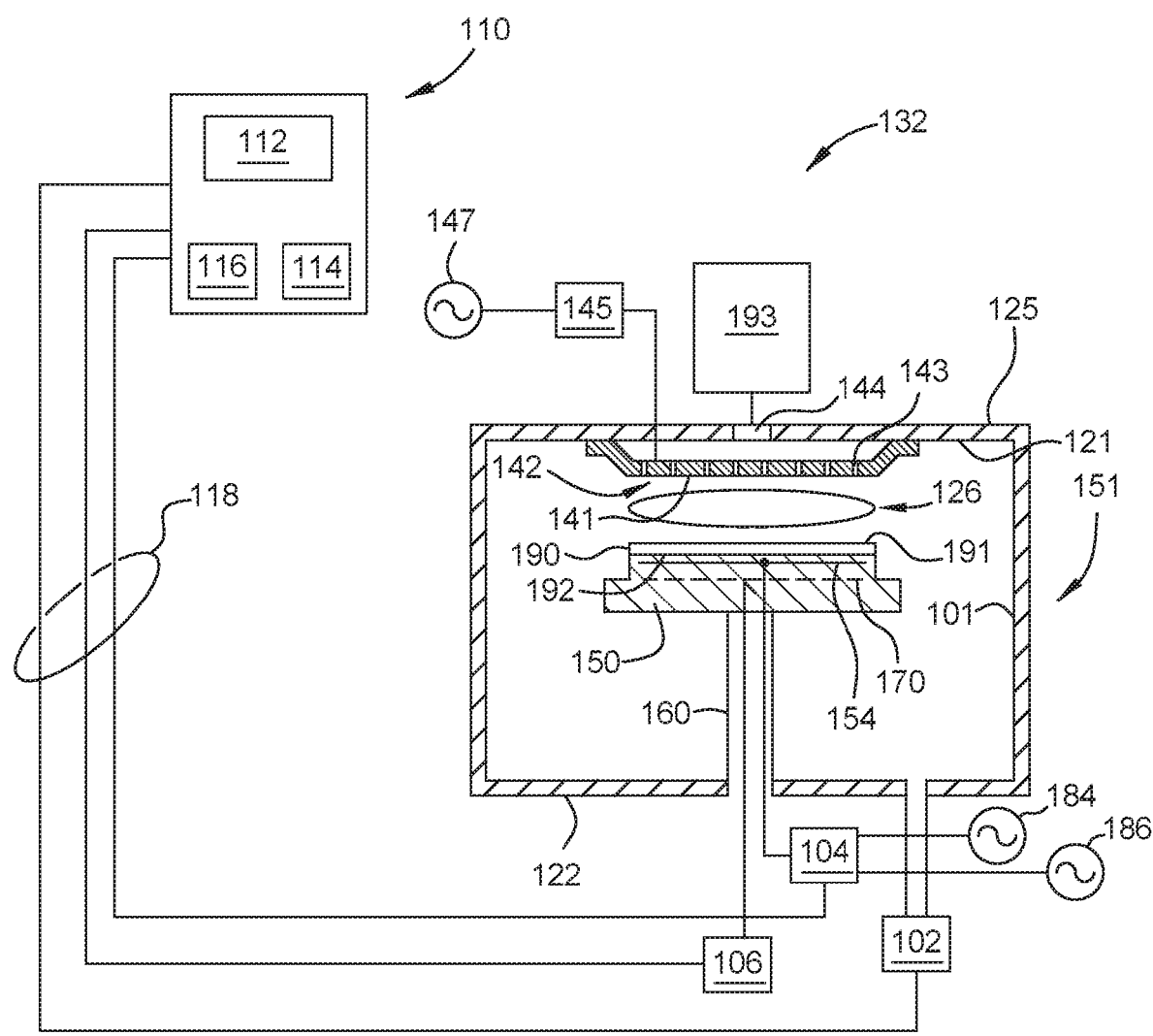
FIG. 1 depicts a schematic view of a processing chamber according to an embodiment of the present disclosure.

FIG. 1 is a schematic view of a processing system 132 suitable for performing a plasma process described herein. The processing system 132 may be a suitably adapted CENTURA®, Producer® SE or Producer® GT or Producer® XP processing system available from Applied Materials, Inc., of Santa Clara, Calif. It is contemplated that other processing systems, including those produced by other manufacturers, may benefit from embodiments described herein.

The processing system 132 includes a chamber body 151. The chamber body 151 includes a chamber lid 125, a sidewall 101 and a bottom wall 122 that define an interior volume 126.

A substrate support pedestal 150 is provided in the interior volume 126 of the chamber body 151. The pedestal 150 is fabricated from aluminum, ceramic, and other suitable materials. In one embodiment, the pedestal 150 is fabricated by a ceramic material, such as aluminum nitride, which is a material suitable for use in a high temperature environment, such as a plasma process environment, without causing thermal damage to the pedestal 150. The pedestal 150 is capable of moving in a vertical direction inside the chamber body 151 using a lift mechanism (not shown).

The pedestal 150 may include an embedded heater element 170 suitable for controlling the temperature of a substrate 190 supported on the pedestal 150. The pedestal 150 may be resistively heated by applying an electric current (e.g., alternating current) from a power supply 106 to the heater element 170. The electric current supplied from the power supply 106 is regulated by the controller 110 to control the heat generated by the heater element 170, thereby maintaining the substrate 190 and the pedestal 150 at a substantially constant temperature during film deposition at any suitable temperature range. The substrate 190 is retained on the pedestal 150 by clamping, vacuum, electrostatic chucking, or gravity.

The pedestal 150 is configured as a cathode having the electrode 192 embedded therein coupled to at least one RF bias power source (e.g., RF bias power sources 184, 186). The RF bias power sources 184, 186 are coupled between the electrode 192 disposed in the pedestal 150 and another electrode, such as an electrode 141 of the gas distribution plate 142 or an electrode 121 chamber lid 125 of the processing system 132. The RF bias power source 184, 186 excites and sustains a plasma discharge formed from the gases disposed in the processing region of the processing system 132.

The RF bias power sources 184, 186 are coupled to the electrode 192 disposed in the pedestal 150 through a matching circuit 104. The signal generated by the RF bias power source 184, 186 is delivered through matching circuit 104 to the pedestal 150 through a single feed to ionize the gas mixture provided in the plasma processing system 132, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts.

A vacuum pump 102 is coupled to a port formed in the bottom 122 of the chamber body 151. The vacuum pump 102 is used to maintain a desired gas pressure in the chamber body 151. The vacuum pump 102 also evacuates post-processing gases and by-products of the process from the chamber body 151.

The processing system 132 includes one or more gas delivery passages 144 coupled through the chamber lid 125 of the processing system 132. The gas delivery passage 144 is coupled to the gas source 193 to provide a gas mixture into the interior volume 126. In one embodiment, which can be combined with any embodiment described herein, the gas mixture supplied through the gas delivery passage 144 is further delivered through a gas distribution plate 142 disposed below the gas delivery passage 144. The gas distribution plate 142 has a plurality of apertures 143 and is coupled to the chamber lid 125 of the chamber body 151 above the pedestal 150. The apertures 143 of the gas distribution plate 142 are used to introduce process gases from the gas source 193 into the chamber body 151. The apertures 143 may have different sizes, number, distributions, shape, design, and diameters to facilitate the flow of the various process gases for different process requirements. A plasma is formed from the process gas mixture exiting the gas distribution plate 142 to enhance thermal decomposition of the process gases resulting in the deposition of material on the surface 191 of the substrate 190.

The gas distribution plate 142 and substrate support pedestal 150 form a pair of spaced apart electrodes in the interior volume 126. One or more RF sources 147 provide a potential through a matching network 145 to the gas distribution plate 142 to facilitate generation of a plasma between the gas distribution plate 142 and the pedestal 150. Alternatively, the RF sources 147 and matching network 145 are coupled to the gas distribution plate 142, substrate support pedestal 150, or coupled to both the gas distribution plate 142 and the substrate support pedestal 150. The RF sources 147 provide about 10 Watts and about 3000 Watts at a frequency of about 30 kHz to about 14 MHz, such as about 13.6 MHz.

Examples of gases that may be supplied from the gas source 193 may include a silicon-containing gas, fluorine or chlorine containing gas, oxygen-containing gas, hydrogen-containing gas, carbon-containing gas, inert gas and carrier gases. Suitable examples of gases include a silicon-containing gas, such as $SiH_4$, $Si_2H_6$, $SiF_4$, $SiH_2Cl_2$, $Si_4H_{10}$, $Si_5H_{12}$, tetraethyl orthosilicate (TEOS), (3-aminopropyl)triethoxysilane, triethoxymethylsilane, chloropentamethyldisilane or combination(s) thereof. Example carrier gases (e.g., dilution gas) include nitrogen ($N_2$), argon (Ar), hydrogen ($H_2$), and helium (He). Suitable carbon-containing gases include alkanes (e.g., propane), and alkenes (e.g., acetylene, propylene). Example oxygen containing gases include oxygen ($O_2$), ozone ($O_3$), water vapor ($H_2O$), nitrous oxide, or combination(s) thereof.

The controller 110 includes a central processing unit (CPU) 112, a memory 116, and a support circuit 114 utilized to control the process sequence and regulate the gas flows from the gas source 193. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is coupled to the CPU 112 and may include cache, clock circuits, input/output systems, power supplies, and the like. Bi-directional communications between the controller 110 and the various components of the processing system 132 are handled through numerous signal cables collectively referred to as signal buses 118, some of which are illustrated in FIG. 1.

Figure 2:
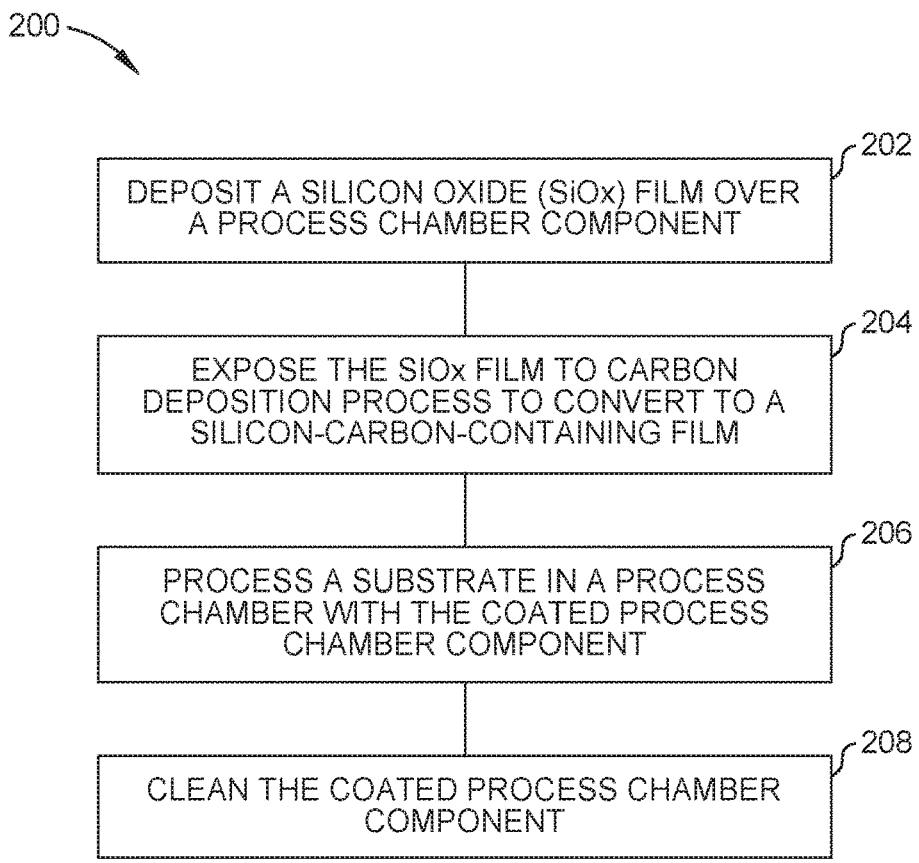
FIG. 2 depicts a flow diagram of a cleaning method according to an embodiment of the present disclosure.

FIG. 2 depicts a flow diagram of a seasoning and cleaning method according to an embodiment of the present disclosure. At operation 202, a silicon oxide (SiOx) film is deposited over a process chamber component, and/or over interior surfaces of a process chamber. Depositing the silicon oxide includes introducing one or more deposition gases to a process volume of a process chamber. As used herein, the term "silicon oxide" refers to a composition including the formula SiOx, where x is any positive value. In particular, silicon oxide is one or more of silicon dioxide (e.g., quartz), silicon monoxide, non-stoichiometric silicon oxide, silanol (SiOH), or combination(s) thereof.

The deposition gas includes a silicon-containing gas, an oxygen-containing gas, and a dilution gas. The silicon-containing gas is selected from the group consisting of $SiH_4$, $Si_2H_6$, $SiF_4$, $SiH_2Cl_2$, $Si_4H_{10}$, $Si_5H_{12}$, Tetraethyl orthosilicate (TEOS), (3-aminopropyl)triethoxysilane, triethoxymethylsilane, chloropentamethyldisilane and combination(s) thereof. A ratio of silicon-containing gas (such as silane) to oxygen-containing gas is about 0.007 to about 0.08 by volume. The dilution gas is selected from the group consisting of nitrogen ($N_2$), argon (Ar), hydrogen ($H_2$), helium (He), nitrogen, nitrous oxide, and combination(s) thereof. The oxygen-containing gas is selected from a group consisting of oxygen ($O_2$), ozone ($O_3$), water vapor ($H_2O$), nitrous oxide (e.g., nitrogen monoxide), and combination(s) thereof.

Depositing the silicon oxide film includes flowing the silane-containing gas and the oxygen-containing gas at a silane-containing gas to oxygen-containing gas flow ratio of about 0.008 to about 0.03. In some embodiments, which can be combined with other embodiments described herein, the gases are suppled from the gas source 193, or other gas sources (not shown) that are introduced into the process chamber separately, or mixed prior to introducing into the processing system 132.

Depositing the silicon oxide film further includes energizing the deposition gas. The RF power sources 147, 184, 186 provide radio frequency energy to activate the gases and enable the deposition process. The RF power and gas flow rate is adjusted to deposit silicon oxide film of a specified silicon to oxygen ratio, thereby providing a good adhesion to the subsequent deposited film. Furthermore, the RF power and gas flow rate is adjusted to control the deposition rate of the silicon oxide film, thereby efficiently depositing the silicon oxide film with predetermined properties such as film thickness, film density, and other film quality attributes which are described herein. It has been discovered that a silicon-containing gas flow (sccm) to power (W) ratio of less than 0.07 provides a silicon oxide coating having the predetermined properties described herein.

Energizing the deposition gas forms a silicon oxide ($SiO_x$) film over a process chamber component. A film thickness of the silicon oxide film is about 2 kÅ to about 35 kÅ, such as about 3 kÅ to about 7 kÅ, such as about 5 kÅ. The silicon oxide film is coated on an interior surface of the processing chamber, such as one or more chamber components, such as one or more chamber components functioning as a faceplate, electrodes or chamber component with electrodes embedded therein. Any and all surfaces of any and all chamber components are contemplated, including, but not limited to, a gas distribution plate 142 (e.g., faceplate with or without an electrode 141), a chamber lid 125 (with or without an electrode 121), a pedestal 150 (with or without an electrode 192), a sidewall 101, a bottom wall 122, or combination(s) thereof. Without being bound by theory, it is believed that energizing gases during film deposition and/or plasma cleaning causes ion sputtering on chamber component surfaces, such as aluminum surfaces. Ion sputtering damage occurs during plasma initiation as well as high energy ion bombardment such as during RF cleaning. It has been discovered that the silicon oxide film that is deposited does not sputter and protects the underlying surface. The silicon oxide film is deposited on surfaces of chamber components as well as within small surface area spaces such as within faceplate orifices.

Figure 3:
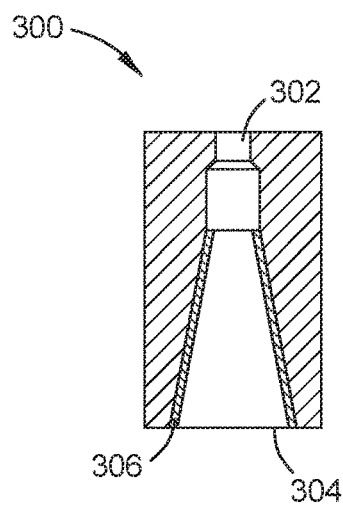
FIG. 3 depicts a schematic, cross-sectional side view of a faceplate orifice according to an embodiment of the present disclosure.

FIG. 3 depicts a schematic, cross-sectional side view of a faceplate orifice 300 according to an embodiment of the present disclosure. The orifice 300 is substantially cone shaped with an orifice inlet 302 configured to receive process gasses, and an outlet 304 in fluid communication with the chamber volume. The method provided herein provides improved coverage of the outer surface of the faceplate and within the interior surface of the orifice as shown by the layer 306. The coating covers more than 50% of the interior surface area of the orifice, such as about 50% to about 90%, such as about 80%. Other RF coatings cover less than 50% of the interior surface of the orifice of the faceplate.

In some embodiments, which can be combined with other embodiments described herein, an outer surface of one or more electrodes are coated with the silicon oxide film. The electrodes include powered electrodes, ground electrodes, cathodes, anodes, components including electrodes, and combination(s) thereof. The electrodes are composed of aluminum, aluminum oxide, aluminum carbide, aluminum nitride, alloys thereof, or combinations thereof, such as AlOC, such as AlOCN. In some embodiments, which can be combined with other embodiments described herein, depositing the silicon oxide film includes depositing the silicon oxide film over an electrode 141 of a distribution plate 142 composed of AlOC. In some embodiments, which can be combined with other embodiments described herein, depositing the silicon oxide film includes depositing the silicon oxide film over an electrode 192 of a pedestal 150 composed of AlOCN.

The silicon oxide film includes one or more of a thickness of about 3 kÅ to about 7 kÅ, a refractive index (RI) at 633 nm of about 0.2 to about 0.3, a hydrofluoric acid (HF) wet etch rate thickness of about 70 Angstroms to about 85 Angstroms at a radiofrequency power of about 500 W, an $SiO_x$ density of about 1.5 g/cc to about 2.6 g/cc, as determined by X-ray reflectrometry, an $SiO_x$ hardness of about 5 Gpa to about 8 Gpa, as determined using nanoindentation with Agilent NanoG300 tool conforming to ISO 14577, and an $SiO_x$ modulus of about 50 Gpa to about 90 Gpa, as determined using nanoindentation with Agilent NanoG300 tool conforming to ISO 14577. As used herein HF wet etch rate thickness is measured by dipping a substrate having the silicon oxide film into hydrochloride solution with 100:1 diluted HF for 60 seconds. The HF wet etch rate thickness provides a measure of film quality of the film collected on a substrate during film deposition for test purposes. Although certain physical properties determined herein are measured using the disclosed tools and methods, it is also contemplated to arrive at equivalent physical properties using other methods and tools known in the industry.

A surface roughness (Ra) of the $SiO_x$ film is about 0.1 nm to about 0.4 nm, determined by measuring a surface roughness of a substrate after forming the film as described herein over the substrate and measuring the roughness based on atomic force microscopy. It is believed that surface roughness correlates to film quality and ability to withstand high energy ion bombardment that is typically used during cleaning processes. The surface roughness of the $SiO_x$ film is maintained at about 0.1 nm to about 0.4 nm before and after high energy bombardment. Conventional films such as ex situ ALD coatings, or other in situ CVD coatings were found to have surface roughness up to an Ra of about 2.7 nm before high energy ion bombardment and an Ra of below 1.0 after high energy ion bombardment. Thus, the silicon oxide films (e.g., coatings) described herein have higher resistance to high energy ion bombardment as demonstrated by a less than 5%, or less than 3%, or less than 1% change in oxygen concentration after bombardment. In particular, the silicon oxide films have a starting surface roughness that is about 2 times to about 15 times, such as about 5 times to about 10 times lower than the starting surface roughness of conventional coatings. The silicon oxide coatings further demonstrate about 10% to about 20% reduction in wet etch rate, demonstrated by a hydrofluoric acid wet etch test, compared to conventional films. The silicon oxide coating exhibited sufficient emissivity control as demonstrated by a refractive index (RI) at 633 nm of about 0.2 to about 0.3.

Consistent emissivity during, between, and after processing affects process conditions, such as temperature control. A temperature sensor (not shown) such as a thermocouple or a pyrometer is capable of sensing a temperature of the electrode 192 or the pedestal 150 and provide the temperature information to feedback temperature control of the controller 110. The information is used to determine if power adjustment to the pedestal 150 is necessary. If emissivity of the silicon oxide coating is not controlled (e.g., changes from run-to-run), temperature control of the substrate is affected and can lead to device property shift or damage after processing a quantity of devices. In some embodiments, which can be combined with other embodiments described herein, a substrate temperature is maintained at about 400° C. to about 650° C., and a pressure of the process volume is maintained at about 0.05 Torr to about 12 Torr.

At operation 204, the silicon oxide film is exposed to a carbon deposition process to convert at least a portion of the silicon oxide to a silicon-carbon-containing film. In some embodiments, which can be combined with other embodiments described herein, the entire silicon oxide film is converted to a silicon-carbon-containing film. Alternatively, at least the upper 3 nm to about 5 nm of the silicon oxide film is converted to a silicon carbide compound. The at least about 3 nm to about 5 nm makes up about 1% of the total thickness of the silicon oxide film disposed at an upper surface of the silicon oxide film opposite of the chamber component. The carbon deposition process includes introducing a carbon-containing gas to the process volume to form a silicon-carbon-containing film on the silicon oxide film and/or to convert the silicon oxide film to a silicon-carbon containing film.

The conversion reaction is summarized in Formula 1 and/or Formula 2 below.
Formula 1. Silanol to silicon carbide.

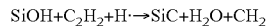

Formula 2. Silicon dioxide to Silicon Carbide.

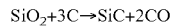

Alternatively, or additionally, the silicon oxide is converted to a silicon oxycarbide (SiOC). The carbon-containing gas is composed of hydrocarbons such as, alkanes (e.g., ethane, propane), alkenes (e.g., acetylene, propylene), mixtures thereof, or combination(s) thereof. The carbon-containing gas includes a carrier gas such as hydrogen gas, helium gas, argon gas, nitrogen gas, combination(s) thereof. The gases can be energized using an RF frequency of about 10 MHz to about 14 MHz, such as about 13.6 mHz.

The silicon-carbon-containing film has one or more of a density of about 2.0 g/cc to about 4.5 g/cc, as determined by X-ray reflectrometry, a hardness of about 15 Gpa to about 30 Gpa, as determined using nanoindentation with Agilent NanoG300 tool conforming to ISO 14577, an oxygen concentration of about 65 atomic % to about 66.2 atomic %, and a modulus of about 400 Gpa to about 515 Gpa, as determined using nanoindentation with Agilent NanoG300 tool conforming to ISO 14577. The high modulus, hardness, and density of the silicon carbide film provides a protective barrier over the chamber component resistant to high ion bombardment.

At operation 204, a substrate 190 is processed in the process chamber with the coated process chamber component. In some embodiments, which can be combined with other embodiments described herein, processing the substrate includes depositing a carbon-containing film over a substrate disposed in the chamber. In some embodiments, which can be combined with other embodiments described herein, operation 204 and operation 206 occur at least partially simultaneously such that a carbon-containing film is deposited over the substrate and the silicon oxide film over the chamber component is converted to a silicon carbide simultaneously.

At operation 208, the coated process chamber component is cleaned using a RF cleaning process including etching the silicon-and-carbon-containing film using oxygen plasma. The cleaning process includes supplying a cleaning gas mixture to the processing system 132 to clean the interior of the plasma processing chamber, including one or more coated chamber components, such as coated electrodes. The cleaning gas mixture includes at least a fluorine-containing gas. The fluorine-containing gas may also include a carrier gas, such as a nonreactive gas, such as an inert gas. The fluorine-containing gas in the cleaning gas mixture is selected from a group consisting of $NF_3$, $SF_6$, HF, $CF_4$, mixtures thereof, and combination(s) thereof. The carrier gas is helium, argon, or combinations thereof. The cleaning gas is any suitable dry etch composition. In one example, oxygen plasma is used for etching. The cleaning gas is energized to a plasma using RF power and is capable of removing contaminants disposed in the process chamber. The silicon carbide and/or silicon oxide coated components described herein, are resistant to the cleaning plasma.

In addition, the silicon carbide or silicon oxycarbide films described herein are self-renewing. During a deposition process, such as when forming a carbon hardmask on a substrate, the carbon-containing precursors gas reacts with the silicon oxide chamber seasoning to form silicon carbide or silicon oxycarbide. During subsequent cleaning processes, if any carbon is removed by the cleaning chemistry, the carbon will be replaced in a subsequent deposition processes following the cleaning. In such a manner, the integrity of the seasoning material (e.g., the silicon carbide or the silicon oxycarbide) is maintained significantly longer than conventional seasoning films.

In summation, method for coating a surface of a chamber component, such as an electrode and/or a component having an electrode is provided. The coating is resistant to cleaning processes, has good emissivity control, and reduces risk of device property drift.

Certain features, structures, compositions, materials, or characteristics described herein is combined in any suitable manner in one or more embodiments. Although the present disclosure herein has been described with reference to particular embodiments, it is to be understood that these embodiments are merely illustrative of the principles and applications of the present disclosure. It will be apparent to those skilled in the art that various modifications and variations can be made to the method and systems of the present disclosure. Thus it is intended that the present disclosure include modifications and variations that are within the scope of the appended claims and their equivalents.

The invention claimed is:

1. A method comprising:
   introducing a treatment gas to a process volume of a process chamber, wherein the treatment gas comprises a silane gas and an oxygen-containing gas, a ratio of silane gas to oxygen-containing gas is about 0.007 to about 0.08 by volume;
   energizing the silane gas using a silane flow (sccm) to power (W) ratio of less than 0.07, wherein energizing the silane gas forms a silicon oxide ($SiO_x$) film over a process chamber component, wherein the $SiO_x$ film comprises a refractive index (RI) at 633 nm of about 0.2 to about 0.3; and
   introducing a carbon-containing gas to the process volume to form a silicon-and-carbon-containing film on the process chamber component.

2. The method of claim 1, wherein introducing a carbon-containing gas comprises converting the silicon oxide film to a silicon-and-carbon-containing film comprising silicon oxycarbide (SiOC), silicon carbide (SiC), or combination thereof.

3. The method of claim 2, further comprising etching the silicon-and-carbon-containing film using oxygen plasma.

4. The method of claim 2, wherein the $SiO_x$ film comprises one or more of:
an $SiO_x$ density of about 1.5 g/cc to about 2.6 g/cc, as determined by X-ray reflectometry;
an $SiO_x$ hardness of about 5 Gpa to about 8 Gpa, as determined based on ISO 14577; and
an $SiO_x$ modulus of about 50 Gpa to about 90 Gpa, as determined based on ISO 14577.

5. The method of claim 2, wherein the silicon-and-carbon-containing film comprises one or more of:
an SiC density of about 2.0 g/cc to about 4.5 g/cc, as determined by X-ray reflectometry;
an SiC hardness of about 15 Gpa to about 30 Gpa, as determined based on ISO 14577; and
an SiC modulus of about 400 Gpa to about 515 Gpa, as determined based on ISO 14577.

6. The method of claim 5, wherein the oxygen-containing gas comprises oxygen ($O_2$), ozone ($O_3$), water vapor ($H_2O$), nitrous oxide, or combination(s) thereof.

7. The method of claim 6, wherein the carbon-containing gas comprises propylene, acetylene, propane, or combination(s) thereof.

8. The method of claim 5, wherein the carbon-containing gas includes a carrier gas, the carrier gas comprising nitrogen, hydrogen, helium, argon, or combination(s) thereof.

9. The method of claim 1, wherein the silane gas comprises $SiH_4$, $Si_2H_6$, $SiF_4$, $SiH_2Cl_2$, $Si_4H_{10}$, $Si_5H_{12}$, Tetraethyl orthosilicate (TEOS), (3-aminopropyl)triethoxysilane, triethoxymethylsilane, chloropentamethyldisilane, or combination(s) thereof.

10. The method of claim 1, wherein energizing the silane gas with an RF power comprises applying an RF frequency of about 10 MHz to about 16 MHz.

11. The method of claim 1, wherein a temperature of a pedestal is about 400° C. to about 650° C. and a pressure of the process volume is about 0.05 Torr to about 12 Torr.

12. The method of claim 1, wherein the treatment gas further comprises a dilution gas comprising nitrogen, argon, helium, or combination(s) thereof.

13. The method of claim 1, further comprising processing a substrate in the process volume at least partially simultaneously with introducing the carbon-containing gas to the process volume such that a carbon-containing film is deposited over the substrate and the silicon oxide ($SiO_x$) film over the chamber component is converted to the silicon-carbon-containing film simultaneously.

14. A method comprising:
introducing a treatment gas to a process volume of a process chamber, wherein the treatment gas comprises a silane gas and an oxygen-containing gas, a ratio of silane gas to oxygen-containing gas is about 0.007 to about 0.08 by volume;
energizing the silane gas to form a silicon oxide ($SiO_x$) film over a process chamber component, wherein the $SiO_x$ film comprises a refractive index (RI) at 633 nm of about 0.2 to about 0.3 and a surface roughness (Ra) of the $SiO_x$ film is about 0.1 nm to about 0.4 nm, determined by measuring a surface roughness of a substrate after forming the film over the substrate and measuring the roughness based on atomic force microscopy; and
introducing a carbon-containing gas to the process volume to deposit a carbon-containing film on the process chamber component.

15. The method of claim 14, wherein the process chamber component comprises aluminum.

16. The method of claim 14, wherein forming the silicon oxide film over the process chamber component comprises forming the silicon oxide film over an interior surface of orifices of a gas distribution plate using in situ chemical vapor deposition.

17. The method of claim 14, wherein the $SiO_x$ film comprises one or more of:
a thickness of about 3 kA to about 7 kA.
an $SiO_x$ density of about 1.5 g/cc to about 2.6 g/cc, as determined by X-ray reflectometry;
an $SiO_x$ hardness of about 5 Gpa to about 8 Gpa, as determined based on ISO 14577; and
an $SiO_x$ modulus of about 50 Gpa to about 90 Gpa, as determined based on ISO 14577.

18. A method comprising:
introducing a treatment gas to a process volume of a process chamber, wherein the treatment gas comprises a silane gas and an oxygen-containing gas, a ratio of silane gas to oxygen-containing gas is about 0.007 to about 0.08 by volume;
energizing the silane gas to form a silicon oxide ($SiO_x$) film over a surface of an electrode, wherein the $SiO_x$ film comprises a refractive index (RI) at 633 nm of about 0.2 to about 0.3; and
introducing a carbon-containing gas to the process volume to form a silicon-carbon-containing film on the surface of the electrode, the silicon-carbon-containing film comprising silicon oxide ($SiO_x$), silicon oxycarbide (SiOC), and silicon carbide (SiC).

19. The method of claim 18, wherein the silicon-carbon-containing film is self-renewing and further comprises one or more of:
a density of about 2.0 g/cc to about 4.5 g/cc, as determined by X-ray reflectometry;
a hardness of about 15 Gpa to about 30 Gpa, as determined based on ISO 14577;
an oxygen concentration of about 65 atomic % to about 66.2 atomic %; and
a modulus of about 400 Gpa to about 515 Gpa, as determined based on ISO 14577.

* * * * *